(12) United States Patent
Kim et al.

(10) Patent No.: US 8,893,380 B2
(45) Date of Patent: Nov. 25, 2014

(54) METHOD OF MANUFACTURING A CHIP EMBEDDED PRINTED CIRCUIT BOARD

(75) Inventors: Hong Won Kim, Suwon-si (KR); Sung Yi, Suwon-si (KR); Tae Sung Jeong, Hwaseong-si (KR); Joon Seok Kang, Suwon-si (JP)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 1234 days.

(21) Appl. No.: 12/320,492

(22) Filed: Jan. 27, 2009

(65) Prior Publication Data

US 2010/0142170 A1 Jun. 10, 2010

(30) Foreign Application Priority Data

Dec. 5, 2008 (KR) .................. 10-2008-0122914

(51) Int. Cl.
*H05K 3/30* (2006.01)
*H01L 23/00* (2006.01)
*H05K 1/18* (2006.01)
*H01L 21/683* (2006.01)
*H05K 3/42* (2006.01)

(52) U.S. Cl.
CPC .............. *H05K 1/185* (2013.01); *H01L 24/96* (2013.01); *H01L 2924/01078* (2013.01); *H05K 2201/10674* (2013.01); *H05K 2201/10515* (2013.01); *H01L 2924/01029* (2013.01); *H01L 24/18* (2013.01); *H01L 24/82* (2013.01); *H01L 2924/01059* (2013.01); *H05K 3/426* (2013.01); *H01L 2224/18* (2013.01); *H01L 2924/01033* (2013.01); *H01L 21/6835* (2013.01); *H01L 2924/01006* (2013.01); *H05K 2203/1461* (2013.01)
USPC ................ 29/841; 29/852; 174/260; 438/127

(58) Field of Classification Search
USPC .................. 29/830–832, 841, 846–849, 852; 174/260, 262; 361/750, 761, 762, 764; 428/901; 438/112, 118, 127, 108
See application file for complete search history.

(56) References Cited

U.S. PATENT DOCUMENTS 6,038,133 A * 3/2000 Nakatani et al. ............. 361/764
7,202,107 B2 * 4/2007 Fuergut et al. ............... 438/118

(Continued)

FOREIGN PATENT DOCUMENTS

JP 2003-204167 7/2003
JP 2004-274035 9/2004

(Continued)

OTHER PUBLICATIONS

Japanese Office Action issued Mar. 29, 2011 in corresponding Japanese Patent Application 2009-022773.

(Continued)

*Primary Examiner* — Donghai D Nguyen

(57) ABSTRACT

The present invention relates to a chip embedded printed circuit board and a manufacturing method thereof and provides a chip embedded printed circuit board including: an insulating layer having vias formed therethrough; a first chip and a second chip embedded in the insulating layer and having pads, which are respectively exposed to upper and lower surfaces of the insulating layer, on one surfaces thereof; an upper pattern formed on the upper surface of the insulating layer to be connected to the pads of the first chip and the vias; and a lower pattern formed on the lower surface of the insulating layer to be connected to the pads of the second chip and the vias. Also, the present invention provides a manufacturing method of a chip embedded printed circuit board.

9 Claims, 3 Drawing Sheets

(56) References Cited

U.S. PATENT DOCUMENTS

| | | | |
|---|---|---|---|
| 7,507,915 B2 * | 3/2009 | Chang et al. | 174/260 |
| 7,834,464 B2 * | 11/2010 | Meyer et al. | 438/108 |
| 2005/0006142 A1 | 1/2005 | Ishimaru et al. | |

FOREIGN PATENT DOCUMENTS

| | | |
|---|---|---|
| JP | 2006-93493 | 4/2006 |
| JP | 2007-8809 | 4/2007 |
| JP | 2007-88009 | 4/2007 |
| JP | 2009-22773 | 2/2009 |
| KR | 10-2006-0066115 | 6/2006 |
| KR | 10-2007-0036341 | 4/2007 |

OTHER PUBLICATIONS

Japanese Office Action dated Jan. 24, 2012 issued in corresponding Japanese Patent Application No. 2009-022773.

Korean Notice of Allowance dated Feb. 1, 2011 issued in corresponding Korean Patent Application No. 10-2008-0122914.

* cited by examiner

METHOD OF MANUFACTURING A CHIP EMBEDDED PRINTED CIRCUIT BOARD

CROSS-REFERENCE TO RELATED APPLICATIONS

This application claims the benefit of Korean Patent Application No. 10-2008-0122914 filed with the Korea Intellectual Property Office on Dec. 5, 2008, the disclosure of which is incorporated herein by reference.

BACKGROUND OF THE INVENTION

1. Field of the Invention

The present invention relates to a chip embedded printed circuit board and a manufacturing method thereof, and more particularly, to a chip embedded printed circuit board and a manufacturing method thereof capable of embedding a dual-chip in an insulating layer by pressing a pair of carrier plates on which the chips are mounted at upper and lower parts of the insulating layer.

2. Description of the Related Art

Recently, electronic components have been developed to achieve high density and high performance in response to demands for high performance and miniaturization of electronic devices. Therefore, a demand for a small printed circuit board capable of mounting electronic components at high density has been gradually increased. In response to this demand, the development of a multilayer circuit board for electrically connecting between wires or between electronic components and wires formed on different layers through via holes has been progressed.

The multilayer circuit board has advantages of reducing the wires connecting between the electronic components and implementing high density wiring. And, the multilayer circuit board also has advantages of increasing a surface area of a printed circuit board and improving electrical characteristics by mounting the electronic components.

Especially, a demand for an embedded printed circuit board in which electronic components are inserted in a substrate has been gradually increased since it can achieve miniaturization, high density, high performance and the like of the substrate by embedding the electronic components in the substrate without mounting the electronic components on a surface of the substrate.

In case of a conventional chip embedded printed circuit board, a chip is positioned after attaching a perforated core substrate to a tape, and then the tape is removed after laminating an insulating layer such as a prepreg layer on an opposite surface of a surface to which the tape is attached. After that, the prepreg layer is also laminated on the surface from which the tape is removed.

Next, a via hole is formed in a part requiring electrical connection by a laser drilling method and the like, and then a copper plating process and the like are performed.

However, as described above, the conventional chip embedded printed circuit board in which the chip is embedded in the perforated core substrate by using the tape has a disadvantage that it is difficult to reduce an entire thickness of the substrate. Also, as described above, in case of forming the via hole by the laser drilling method and the like, since it is difficult to form the via hole in an accurate position due to a position error of the chip or a tolerance of laser drilling and the like, there are problems such as deterioration of yield and reliability due to connection failure and the like.

SUMMARY OF THE INVENTION

The present invention has been proposed in order to solve the above-described problems, and it is, therefore, an object of the present invention to provide a chip embedded printed circuit board and a manufacturing method thereof capable of reducing an entire thickness of a printed circuit board having a dual-chip embedded therein and improving yield and reliability of products by pressing a pair of the carrier plates on which the chips are mounted at upper and lower parts of an insulating layer to embed the dual-chip in the insulating layer.

In accordance with an aspect of the present invention to achieve the object, there is provided a chip embedded printed circuit board including an insulating layer having vias formed therethrough; a first chip and a second chip embedded in the insulating layer and having pads, which are respectively exposed to upper and lower surfaces of the insulating layer, on one surfaces thereof; an upper pattern formed on the upper surface of the insulating layer to be connected to the pads of the first chip and the vias; and a lower pattern formed on the lower surface of the insulating layer to be connected to the pads of the second chip and the vias.

Here, the first chip and the second chip may be arranged in the insulating layer to be separated from each other.

Also, the first chip and the second chip may be vertically arranged in the insulating layer.

Also, the first chip and the second chip may be horizontally arranged in the insulating layer.

Also, the insulating layer may be made of one of prepreg, ABF (Ajinomoto Build-up Film) and resin.

Also, the chip embedded printed circuit board may further include solder resist layers formed on the upper and lower surfaces of the insulating layer to expose portions of the upper pattern and the lower pattern.

And, in accordance with another aspect of the present invention to achieve the object, there is provided a manufacturing method of a chip embedded printed circuit board including the steps of: mounting chips on a pair of carrier plates respectively such that pads provided on one surfaces of the chips are arranged at lower parts of the chips; arranging an insulating layer between the chips by arranging the chips mounted on the pair of carrier plates to face each other; embedding the chips in the insulating layer by pressing the pair of carrier plates to the insulating layer; exposing the pads provided on the chips by separating the pair of carrier plates from the insulating layer; forming vias penetrating the insulating layer; and forming an upper pattern and a lower pattern on upper and lower surfaces of the insulating layer respectively to be connected to the pads of the chips and the vias.

Here, before the step of mounting the chips on the pair of carrier plates respectively such that pads on one surfaces of the chips are arranged at the lower parts of the chips, the method may further include the step of forming adhesion layers on the pair of carrier plates respectively.

Also, the adhesion layers may be made of one of a UV foam tape, a thermal foam tape and PR.

Also, the insulating layer may be made of one of prepreg, ABF and resin.

Also, in the step of arranging the insulating layer between the chips by arranging the chips mounted on the pair of carrier plates to face each other, the insulating layer may be in a temporarily cured state.

Also, in the step of embedding the chips in the insulating layer by pressing the pair of carrier plates to the insulating layer, the chips embedded in the insulating layer may be arranged to be separated from each other.

Also, after the step of forming the upper pattern and the lower pattern on the upper and lower surfaces of the insulating layer respectively to be connected to the pads of the chips and the vias, the method may further include the step of forming solder resist layers on the upper and lower surfaces of the insulating layer respectively to expose portions of the upper pattern and the lower pattern.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
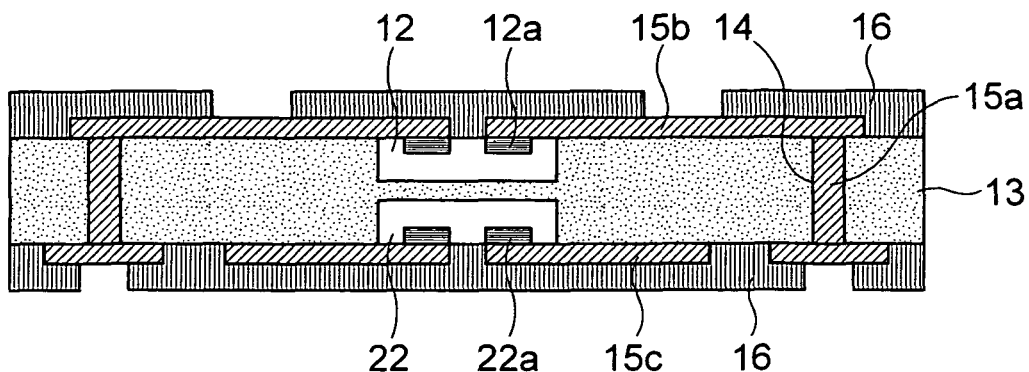
FIG. 1 is a cross-sectional view illustrating a structure of a chip embedded printed circuit board in accordance with an embodiment of the present invention.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

A chip embedded printed circuit board in accordance with an embodiment of the present invention will be described in detail with reference to FIGS. 1 and 2.

Figure 2:
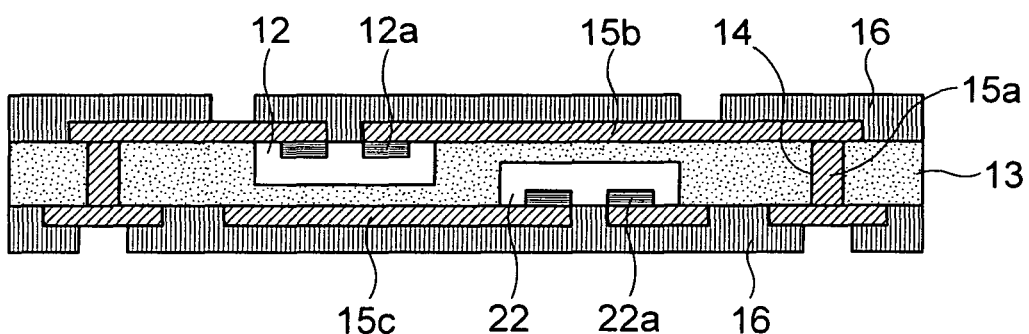
FIG. 2 is a cross-sectional view illustrating another structure of the chip embedded printed circuit board in accordance with the embodiment of the present invention.

FIG. 1 is a cross-sectional view illustrating a structure of the chip embedded printed circuit board in accordance with the embodiment of the present invention, and FIG. 2 is a cross-sectional view illustrating another structure of the chip embedded printed circuit board in accordance with the embodiment of the present invention.

As shown in FIG. 1, the chip embedded printed circuit board in accordance with the embodiment of the present invention includes an insulating layer 13 having vias 15a formed therethrough, a first chip 12 embedded in the insulating layer 13 and having pads 12a, which are exposed to an upper surface of the insulating layer 13, on one surface thereof, a second chip 22 embedded in the insulating layer 13 and having pads 22a, which are exposed to a lower surface of the insulating layer 13, on one surface thereof, an upper pattern 15b formed on the upper surface of the insulating layer 13 to be connected to the pads 12a of the first chip 12 and the vias 15a, and a lower pattern 15c formed on the lower surface of the insulating layer 13 to be connected to the pads 22a of the second chip 22 and the vias 15a.

Here, the first chip 12 and the second chip 22 are arranged in the insulating layer 13 to be separated from each other. At this time, as shown in FIG. 1, the first chip 12 and the second chip 22 may be vertically arranged in the insulating layer 13.

Also, as shown in FIG. 2, the first chip 12 and the second chip 22 may be horizontally arranged in the insulating layer 13, instead of being vertically arranged in the insulating layer 13 as described above.

As shown in FIG. 2, in case that the first and second chips 12 and 22 are horizontally arranged in the insulating layer 13, there is an advantage of reducing an entire thickness of the chip embedded printed circuit board as compared with a case that the first and second chips 12 and 22 are vertically arranged in the insulating layer 13.

The insulating layer 13 having the first and second chips 12 and 22, that is, a dual-chip embedded therein may be made of prepreg, ABF (Ajinomoto Build-up Film), or resin.

And, the vias 15a formed through the insulating layer 13 may be formed by filling insides of via holes 14 with conductive material such as copper through plating and the like after forming the via holes 14 penetrating the insulating layer 13.

The upper pattern 15b and the lower pattern 15c may be made of the same conductive material as the vias 15a such as copper.

Solder resist layers 16 are formed on the upper and lower surfaces of the insulating layer 13 having the dual-chip 12 and 22 embedded therein. At this time, portions of the solder resist layers 16 are removed to expose portions of the upper pattern 15b and the lower pattern 15c.

External connection means such as solder balls (not shown) may be formed on the portions of the upper pattern 15b and the lower pattern 15c, which are exposed by removing the solder resist layers 16.

Since the chip embedded printed circuit board in accordance with the embodiment of the present invention has a structure in which the upper pattern 15b and the lower pattern 15c, which are directly connected to the chips 12 and 22, are formed on the upper and lower surfaces of the insulating layer 13 having the dual-chip 12 and 22 embedded therein, the chip embedded printed circuit board having a two-layered structure in which the total number of layers on which the patterns 15b and 15c are arranged is two can be implemented.

Therefore, in accordance with the embodiment of the present invention, there is an effect of implementing the light, thin and small dual-chip embedded printed circuit board by remarkably reducing the entire thickness of the dual-chip embedded printed circuit board.

Hereinafter, a manufacturing method of a chip embedded printed circuit board in accordance with another embodiment of the present invention will be described in detail with reference to FIGS. 3 to 11.

FIGS. 3 to 11 are process cross-sectional views sequentially illustrating the manufacturing method of the chip embedded printed circuit board in accordance with the embodiment of the present invention.

Figure 3:
FIGS. 3 to 11 are process cross-sectional views sequentially illustrating a manufacturing method of a chip embedded printed circuit board in accordance with another embodiment of the present invention.

First, as shown in FIG. 3, a carrier plate 10 is prepared. At this time, although only one carrier plate 10 is shown in the drawing, it is preferable to prepare a pair of carrier plates 10.

Figure 4:

Next, as shown in FIG. 4, adhesion layers 11 are formed on the pair of carrier plates 10, respectively. The adhesion layers 11 may be made of a UV foam tape, a thermal foam tape, or PR.

Figure 5:
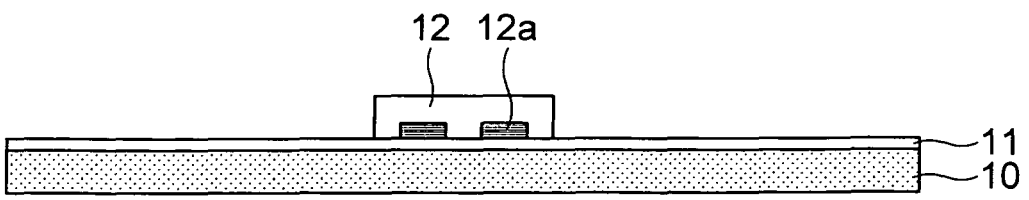

Then, as shown in FIG. 5, chips 12 are mounted on the pair of carrier plates 10 on which the adhesion layers 11 are formed, respectively. At this time, pads 12a are provided on one surface of each of the chips 12. In the embodiment of the present invention, it is preferable that the chips 12 are mounted on the pair of carrier plates 10 such that the pads 12a provided on the chips 12 are arranged at lower parts of the chips 12.

Figure 6:
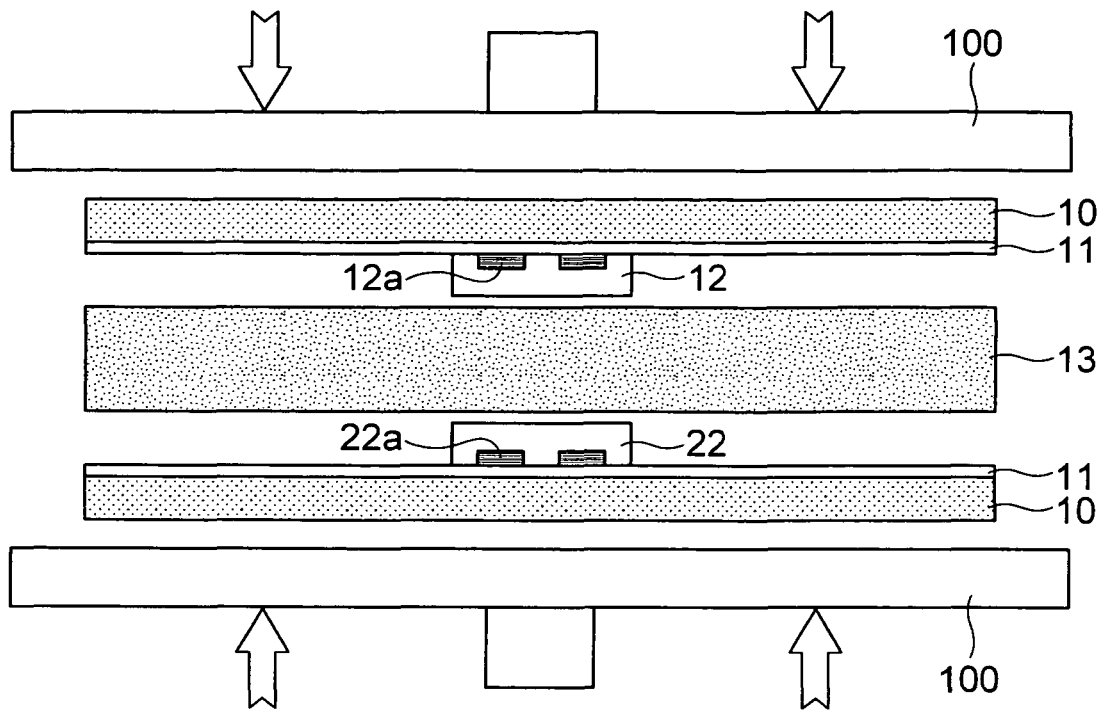

Next, as shown in FIG. 6, the chips 12 and 22 mounted on the pair of carrier plates 10 are arranged to face each other, and then an insulating layer 13 is arranged between the chips 12 and 22.

The insulating layer 13 may be formed of prepreg, ABF, or resin. Also, it is preferable that the insulating layer 13 is in a temporarily cured state to easily embed the chips 12 and 22 therein in the following process of pressing the pair of carrier plates 10 to embed the dual-chip 12 and 22.

Figure 7:
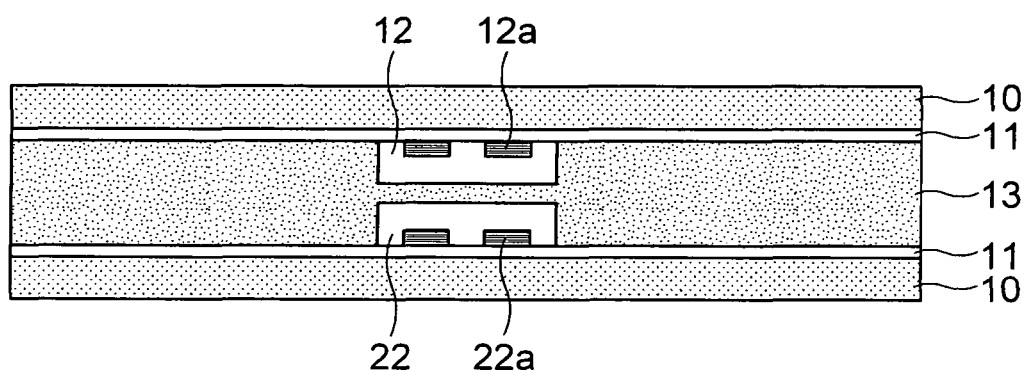

After that, as shown in FIG. 7, the chips 12 and 22 are embedded in the insulating layer 13 by pressing the pair of carrier plates 10 to the insulating layer 13 using compression devices 100 and the like.

At this time, when pressing the pair of carrier plates 10, it is preferable that the chips 12 and 22 embedded in the insulating layer 13 are arranged to be separated from each other without being in contact with each other.

Figure 8:
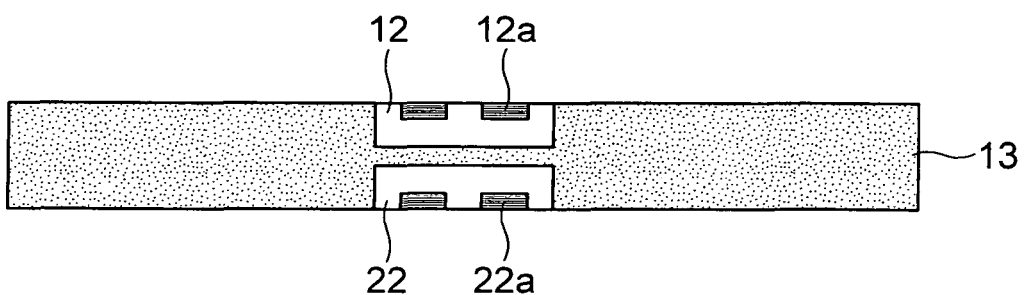

Next, as shown in FIG. 8, the pads 12a and 22a provided on the chips 12 and 22 are exposed by separating the pair of carrier plates 10 from the insulating layer 13 through removal of the adhesion layers 11.

Figure 9:
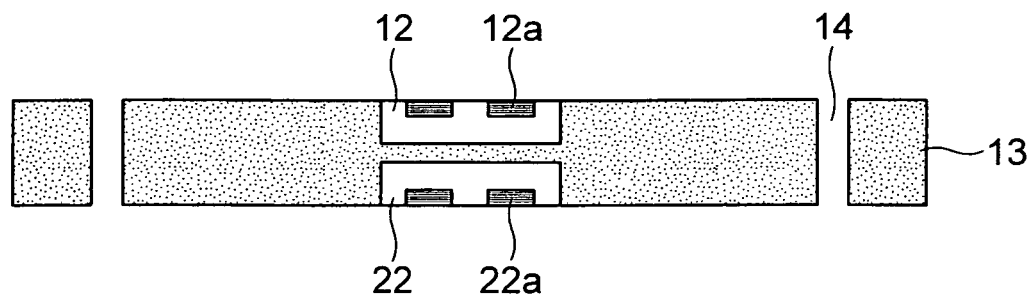

Then, as shown in FIG. 9, via holes 14 penetrating portions of the insulating layer 13 are formed. The via holes 14 are formed by a method such as CNC (Computer Numerical Control) drilling or laser drilling.

Figure 10:
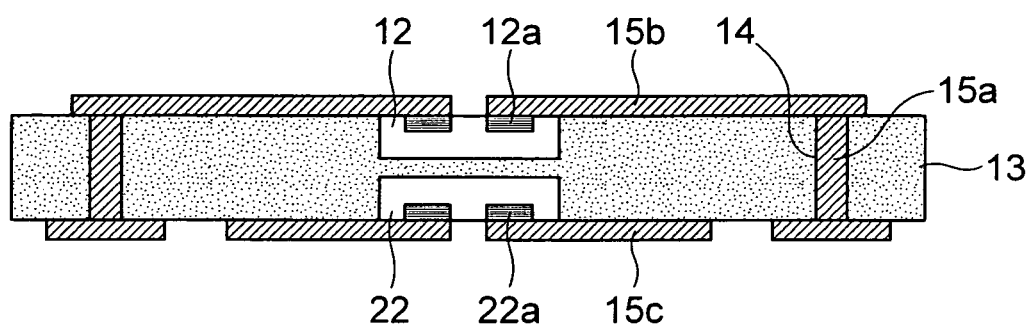

Then, as shown in FIG. 10, after vias 15a are formed by filling insides of the via holes 14 with conductive material such as copper, an upper pattern 15b is formed on an upper surface of the insulating layer 13 to be connected to the pads 12a of the chip 12, which is exposed to the upper surface of the insulating layer 13, and the vias 15a, and a lower pattern 15c is formed on a lower surface of the insulating layer 13 to be connected to the pads 22a of the chip 22, which is exposed to the lower surface of the insulating layer 13, and the vias 15a.

Here, the vias 15a, the upper pattern 15b and the lower pattern 15c can be implemented at high density by an SAP (Semi Additive Process) plating method and the like.

Figure 11:
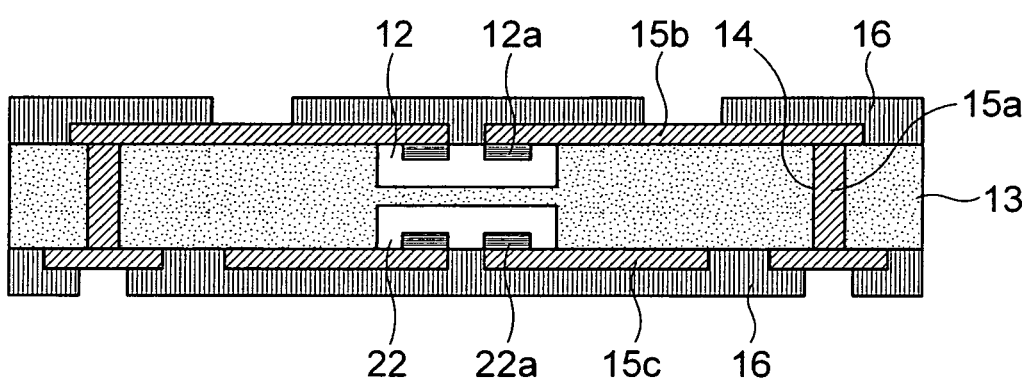

Then, as shown in FIG. 11, after solder resist layers 16 are formed on the upper and lower surfaces of the insulating layer 13, portions of the upper pattern 15b and the lower pattern 15c are exposed by removing portions of the solder resist layers 16.

As described above, in accordance with the embodiment of the present invention, since the upper pattern 15b and the lower pattern 15c, which are directly connected to the chips 12 and 22, are formed on the upper and lower surfaces of the insulating layer 13 after embedding the dual-chip 12 and 22 in the insulating layer 13 by pressing the pair of carrier plates on which the chips 12 and 22 are mounted at upper and lower parts of the insulating layer 13 and then separating the pair of carrier plates 10, there is an effect of implementing the light, thin and small dual-chip embedded printed circuit board by remarkably reducing an entire thickness of the printed circuit board having the dual-chip 12 and 22 embedded therein.

Also, in the embodiment of the present invention, since there is no necessity of additionally using a core layer for embedding the chips, and a process of forming vias for connection between the chips and patterns on different layers can be omitted, there are advantages of simplifying processes, reducing manufacturing cost and improving production yield and reliability of the dual-chip embedded printed circuit board.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A manufacturing method of a chip embedded printed circuit board comprising:
    mounting chips on a pair of carrier plates respectively such that pads on a surface of each chip are arranged at a lower part of the chip;
    arranging an insulating layer between the chips by arranging the mounted chips to face each other;
    inserting the chips into the insulating layer by pressing the pair of carrier plates to the insulating layer so that only the chips are embedded in the insulating layer;
    exposing the pads on the surface of each chip by separating the pair of carrier plates from the insulating layer;
    forming vias penetrating the insulating layer; and
    forming an upper conductive pattern and lower conductive pattern directly on upper and lower surfaces of the insulating layer, respectively, that electrically connects the pads of the chips and the vias.

2. The method according to claim 1, further comprising forming adhesion layers on the pair of carrier plates respectively, before mounting the chips on the pair of carrier plates, such that the pads provided on the surface of each chip are arranged at the lower part of the chip.

3. The method according to claim 2, wherein the adhesion layers are made of one of an ultra-violet (UV) foam tape, a thermal foam tape, and a photoresist (PR).

4. The method according to claim 1, wherein the insulating layer is made of one of prepreg, Ajinomoto Build-up Film (ABF), and resin.

5. The method according to claim 1, wherein in arranging the insulating layer, the insulating layer is in a temporarily cured state.

6. The method according to claim 1, wherein in the inserting the chips into the insulating layer, the chips embedded in the insulating layer are arranged to be separated from each other.

7. The method according to claim 1, further comprising:
    forming solder resist layers on the upper and lower surfaces of the insulating layer, respectively, to expose portions of the upper and lower conductive patterns.

8. The method according to claim 1, wherein in the pressing the pair of carrier plates to the insulating layer, the carrier plates come into direct contact with the insulating layer.

9. The method according to claim 1, wherein in the pressing the pair of carrier plates to the insulating layer, an entire surface of each of the carrier plates that is facing the insulating layer comes into direct contact with the insulating layer.

* * * * *

UNITED STATES PATENT AND TRADEMARK OFFICE
CERTIFICATE OF CORRECTION

| | | |
|---|---|---|
| PATENT NO. | : 8,893,380 B2 | Page 1 of 1 |
| APPLICATION NO. | : 12/320492 | |
| DATED | : November 25, 2014 | |
| INVENTOR(S) | : Hong Won Kim et al. | |

It is certified that error appears in the above-identified patent and that said Letters Patent is hereby corrected as shown below:

On the Title Page
Item [75] (Inventors), Line 4, delete "Suwon-si (JP)" and insert -- Suwon-si (KR) --, therefor.

Signed and Sealed this
Fifth Day of May, 2015

Michelle K. Lee
*Director of the United States Patent and Trademark Office*